United States Patent
Nakanishi et al.

(10) Patent No.: US 12,519,485 B2
(45) Date of Patent: Jan. 6, 2026

(54) CONVERSION DEVICE, MEMORY SYSTEM, DECOMPRESSION DEVICE, AND METHOD

(71) Applicant: Kioxia Corporation, Tokyo (JP)

(72) Inventors: Keiri Nakanishi, Kawasaki Kanagawa (JP); Masato Sumiyoshi, Yokohama Kanagawa (JP); Sho Kodama, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 205 days.

(21) Appl. No.: 18/536,057

(22) Filed: Dec. 11, 2023

(65) Prior Publication Data

US 2024/0223211 A1    Jul. 4, 2024

(30) Foreign Application Priority Data

Jan. 4, 2023 (JP) ................. 2023-000242

(51) Int. Cl.
  *H03M 7/40* (2006.01)
  *H03M 7/30* (2006.01)
(52) U.S. Cl.
  CPC ....... *H03M 7/4093* (2013.01); *H03M 7/3077* (2013.01); *H03M 7/3088* (2013.01); *H03M 7/6005* (2013.01); *H03M 7/6011* (2013.01); *H03M 7/6023* (2013.01)
(58) Field of Classification Search
  CPC ............. H03M 7/4093; H03M 7/3077; H03M 7/3088; H03M 7/6005; H03M 7/6011; H03M 7/6023; H03M 7/4037
  USPC .............................................. 341/67, 50, 51
  See application file for complete search history.

(56) References Cited

U.S. PATENT DOCUMENTS

| | | | |
|---|---|---|---|
| 7,800,519 B2 | 9/2010 | Gonion | |
| 9,094,039 B2 | 7/2015 | Wu et al. | |
| 9,484,954 B1* | 11/2016 | Gopal | H03M 7/4037 |
| 10,020,819 B1* | 7/2018 | Diamant | H03M 7/4037 |
| 10,367,604 B2 | 7/2019 | Martin | |
| 10,461,773 B2* | 10/2019 | Kärkkäinen | H03M 7/6005 |

(Continued)

FOREIGN PATENT DOCUMENTS

| | | | | |
|---|---|---|---|---|
| DE | 102015114973 | * | 3/2016 | ............ H04N 19/13 |
| JP | 2023-007760 A | | 1/2023 | |

(Continued)

OTHER PUBLICATIONS

P. Deutsch, "GZIP file format specification version 4.3", Request for Comments: 1952 (RFC 1952), May 1996, pp. 1-12.

*Primary Examiner* — Jean B Jeanglaude
(74) *Attorney, Agent, or Firm* — Maier & Maier, PLLC

(57) ABSTRACT

According to one embodiment, a conversion device includes a demultiplexer, first to Nth extractors and a deinterleave unit. The demultiplexer extracts first to Nth substreams from a first compressed stream. The first to Nth substreams are placed in order in the first compressed stream and include first variable-length codes to Nth variable-length codes into which first symbols to Nth symbols of a symbol string have been converted. The first to Nth extractors extract the first variable-length codes to the Nth variable-length codes from the first to Nth substreams. The deinterleave unit reorders the first variable-length codes to the Nth variable-length codes in accordance with the symbol string and outputs a second compressed stream.

17 Claims, 12 Drawing Sheets

(56) References Cited

U.S. PATENT DOCUMENTS

| | | | |
|---|---|---|---|
| 10,721,019 B2 | 7/2020 | Martin | |
| 10,784,892 B1 | 9/2020 | Lan et al. | |
| 2012/0262314 A1* | 10/2012 | Carlson | H03M 7/607 |
| | | | 341/87 |
| 2014/0375483 A1* | 12/2014 | Martin | H03M 7/4037 |
| | | | 341/67 |
| 2016/0301942 A1* | 10/2016 | Qiu | H04N 19/40 |
| 2017/0187388 A1* | 6/2017 | Satpathy | H03M 7/6017 |
| 2021/0055932 A1* | 2/2021 | Patel | H03M 7/4037 |
| 2023/0006689 A1 | 1/2023 | Sumiyoshi et al. | |
| 2023/0291418 A1* | 9/2023 | Sumiyoshi | H03M 7/4037 |

FOREIGN PATENT DOCUMENTS

| | | | | |
|---|---|---|---|---|
| WO | 2017112351 | * | 6/2017 | G06F 9/30 |
| WO | 2020130929 | * | 6/2020 | H03M 7/40 |
| WO | 2022231452 | * | 11/2022 | H04M 7/30 |

* cited by examiner

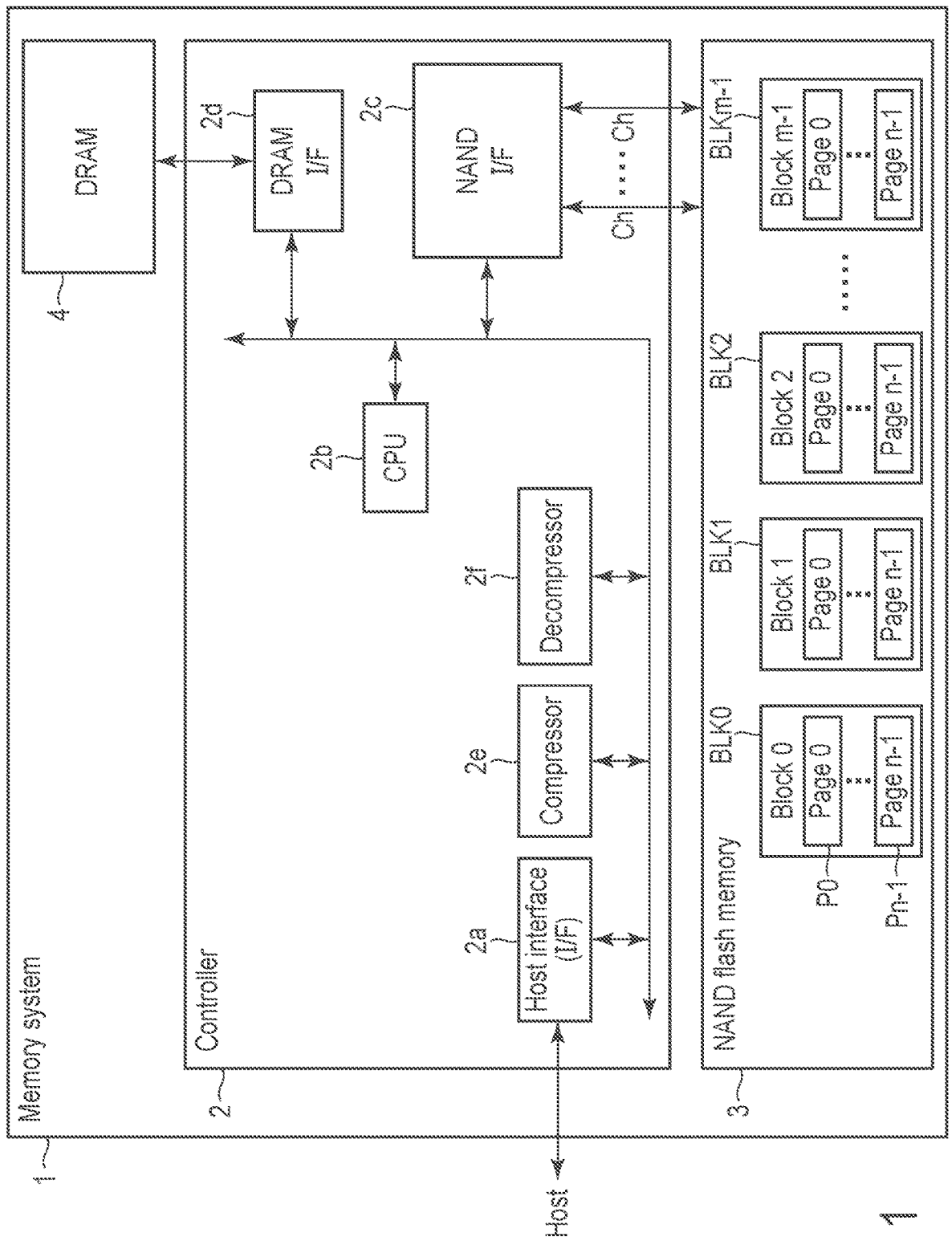
F I G. 1

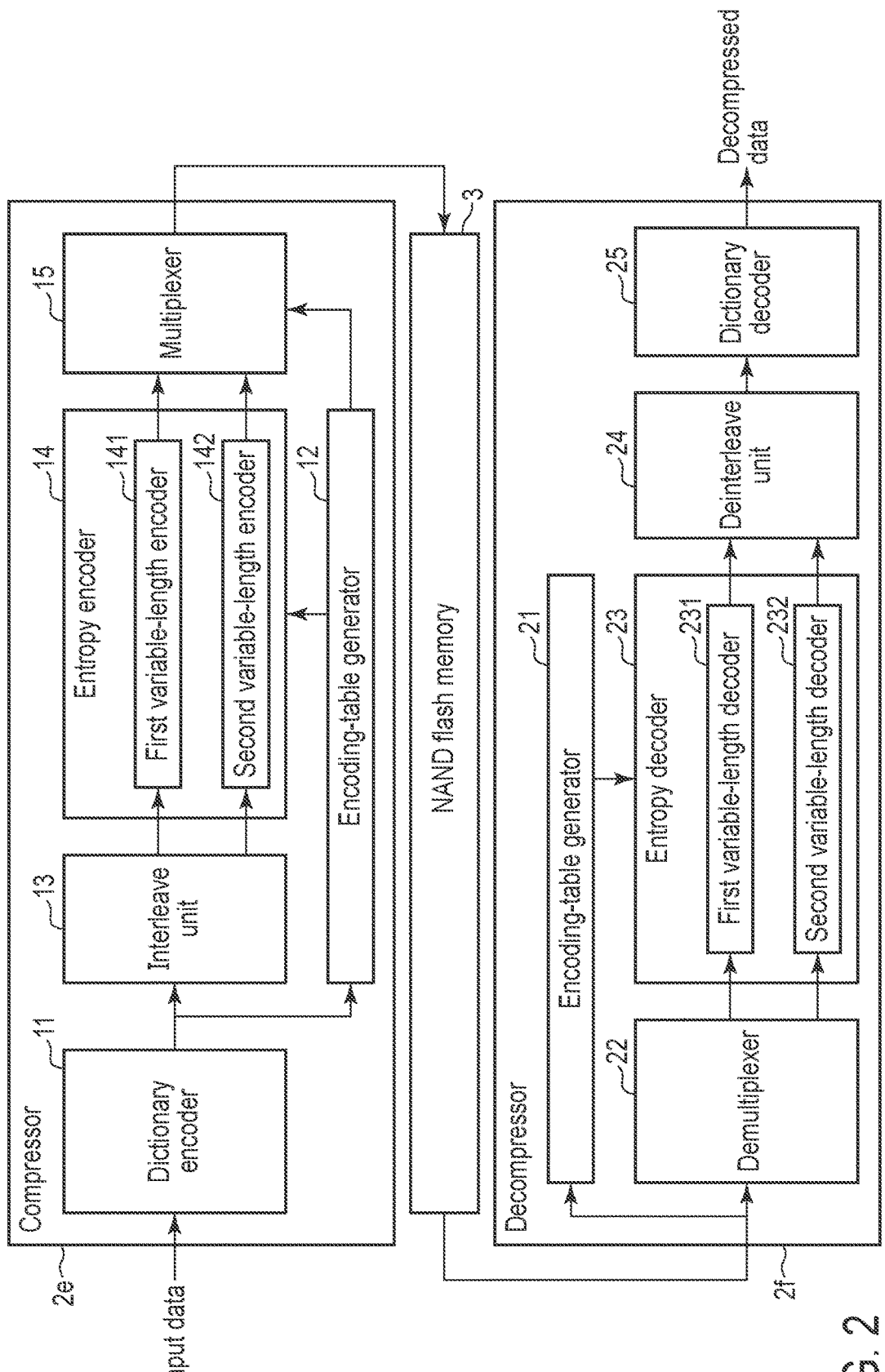
F I G. 2

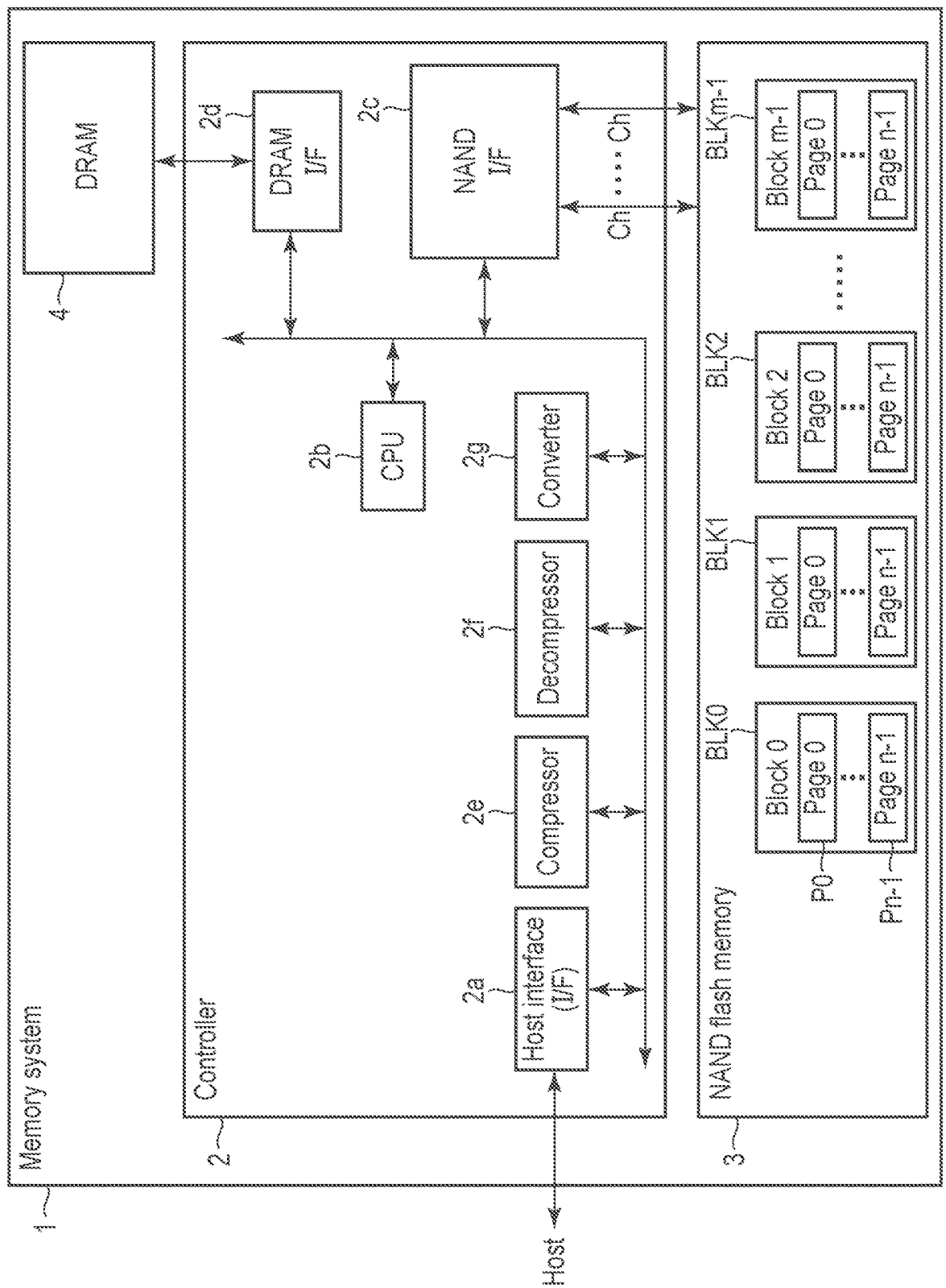
F I G. 5

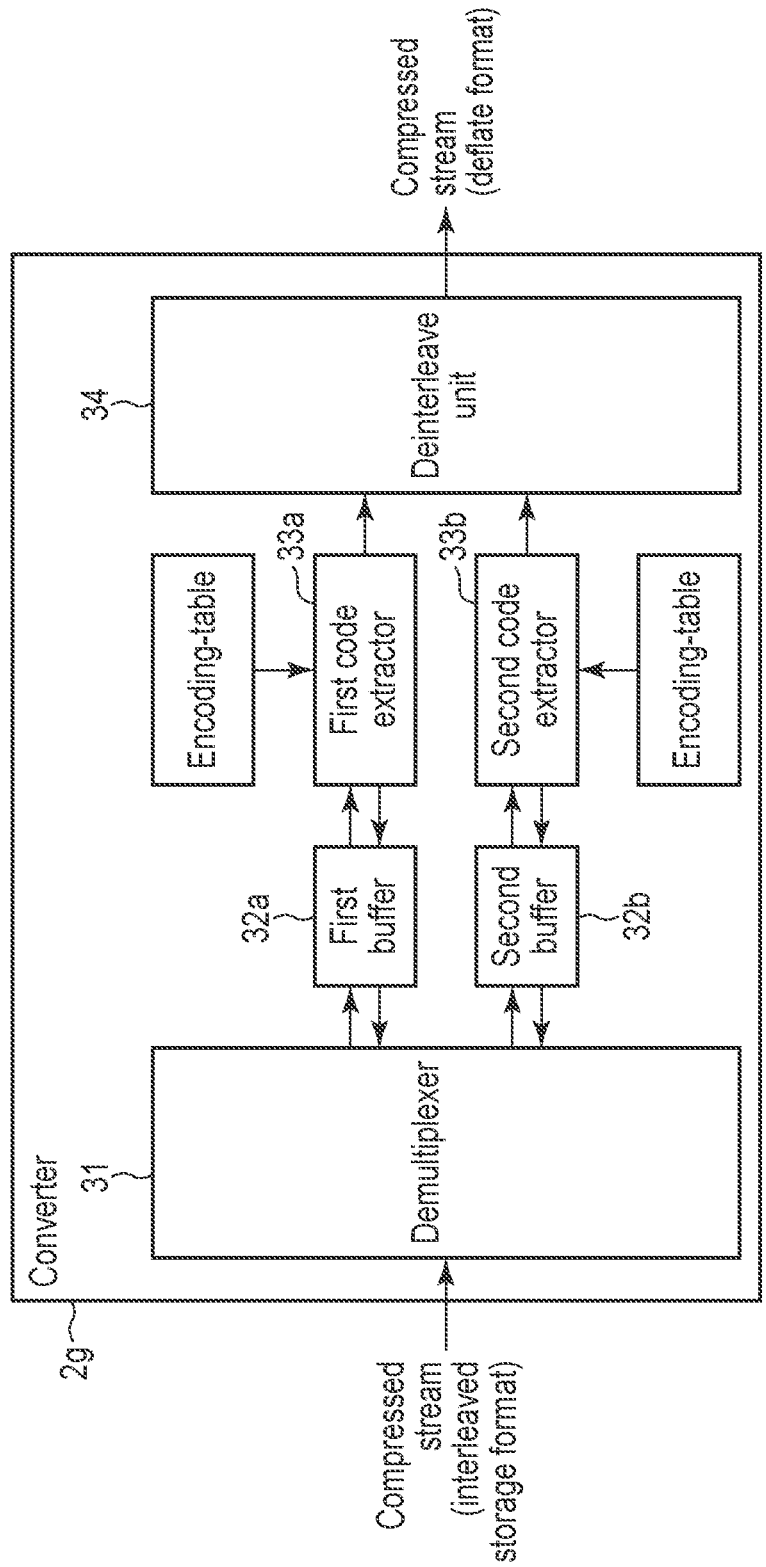
F I G. 6

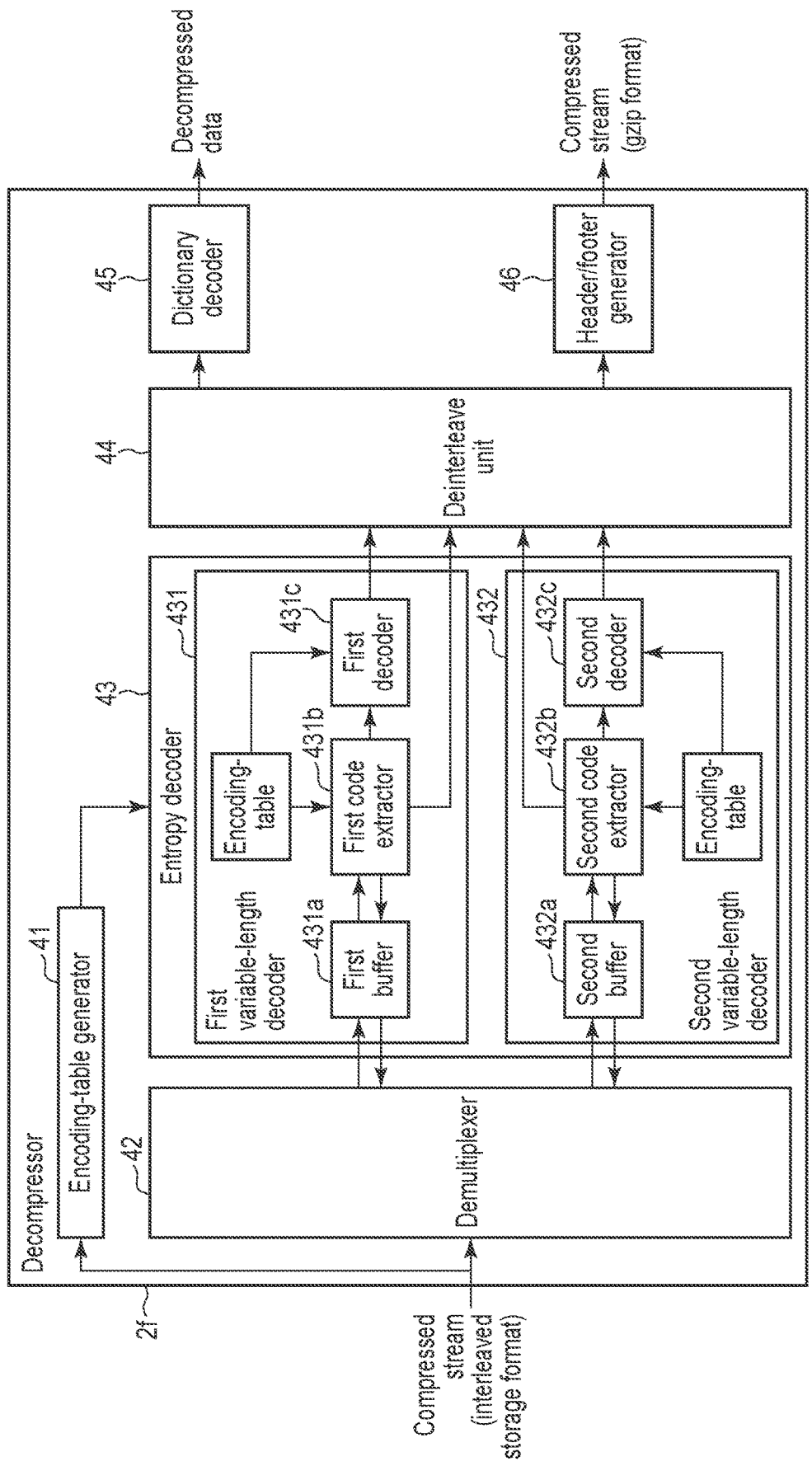
F I G. 12

CONVERSION DEVICE, MEMORY SYSTEM, DECOMPRESSION DEVICE, AND METHOD

CROSS-REFERENCE TO RELATED APPLICATIONS

This application is based upon and claims the benefit of priority from Japanese Patent Application No. 2023-000242, filed Jan. 4, 2023, the entire contents of which are incorporated herein by reference.

FIELD

Embodiments described herein relate generally to a conversion device, a memory system, a decompression device, and a method.

BACKGROUND

In recent years, it has been practice to, for example, compress write data (uncompressed data) by a compressor and write the compressed write data into a nonvolatile memory when a write command is issued from a host, and decompress read data (compressed data) read from the nonvolatile memory by a decompressor and return the decompressed read data to the host when a read command is issued from the host. This can make effective use of the storage area of the nonvolatile memory.

Incidentally, in commonly used compression methods, such as Deflate, a compressed stream (compressed data) in which variable-length codes are packed sequentially is generated. To decompress such a compressed stream, the variable-length codes packed in the compressed stream need to be extracted in order from the head, which makes it difficult to parallelize the process of decompressing the compressed stream.

In contrast, a compression method of generating a compressed stream in which substreams of a fixed width in which interleaved variable-length codes are packed are placed in order (hereinafter, referred to as a first compression method) has been known. The first compression method can easily separate the substreams from the compressed stream, so that the substreams can be processed in parallel (i.e., the process of decompressing the compressed stream can be parallelized).

It is herein assumed that the compressed stream generated by the above-described first compression method (hereinafter, referred to as a first compressed stream) is sent (provided) to an external apparatus and the external apparatus thereby uses the first compressed stream.

In this case, unlike the above-described compression method (hereinafter, referred to as a second compression method), such as Deflate, the first compression method is not a commonly used method. Thus, if the external apparatus is not provided with the function of being capable of decompressing the first compressed stream, the external apparatus cannot use the first compressed stream.

It is therefore conceivable that, for example, a compressed stream into which uncompressed data obtained by decompressing the first compressed stream has been recompressed by a second compression method (hereinafter, referred to as a second compressed stream) is generated and the second compressed stream is sent (provided) to the external apparatus. In this case, if the external apparatus is provided with the function of being capable of decompressing the second compressed stream, the external apparatus can use the second compressed stream.

However, the cost of preparing hardware necessary for such recompression (i.e., providing a compressor conforming to the second compression method to convert the data format of the first compressed stream into the data format of the second compressed stream) is high.

BRIEF DESCRIPTION OF THE DRAWINGS

FIG. 1 is a block diagram schematically illustrating an example of the hardware configuration of a memory system according to a comparative example of a first embodiment.

FIG. 2 is a diagram for explaining an example of the configurations of a compressor and a decompressor in the comparative example of the first embodiment.

FIG. 5 is a block diagram schematically illustrating an example of the hardware configuration of a memory system according to the first embodiment.

FIG. 6 is a diagram for explaining an example of the configuration of a converter according to the first embodiment.

FIG. 12 is a diagram illustrating an example of the configuration of a decompressor according to a modified example of the second embodiment.

DETAILED DESCRIPTION

Figure 3:
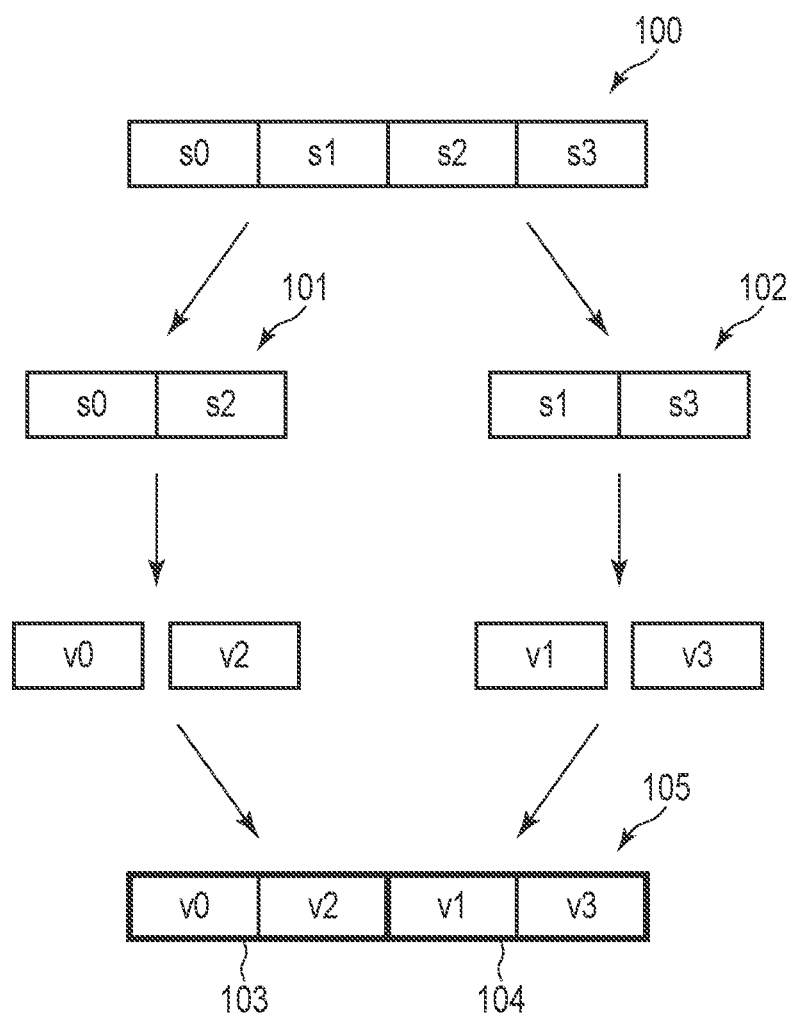
FIG. 3 is a diagram for explaining the schematic operation of the compressor in the comparative example of the first embodiment.

In general, according to one embodiment, a conversion device includes a demultiplexer, first to Nth extractors and a deinterleave unit. The demultiplexer is configured to extract first to Nth substreams from a first compressed stream including the first to Nth substreams, where N is an integer greater than or equal to two. The first to Nth substreams are placed in order in the first compressed stream and include first variable-length codes to Nth variable-length codes into which first symbols to Nth symbols of a symbol string have been converted by subjecting the first symbols to the Nth symbols to entropy coding. The first to Nth extractors are configured to extract the first variable-length codes to the Nth variable-length codes from the first to Nth substreams. The deinterleave unit is configured to reorder the first variable-length codes to the Nth variable-length codes in accordance with the symbol string and output a second compressed stream in which the reordered first variable-length codes to Nth variable-length codes are placed.

Hereinafter, embodiments will be described with reference to the drawings.

First Embodiment

A first embodiment will be described first. FIG. 1 is a block diagram schematically illustrating an example of the hardware configuration of a memory system according to a comparative example of the first embodiment.

A memory system 1 illustrated in FIG. 1 is a semiconductor storage device configured to write data into a nonvolatile memory and to read data from the nonvolatile memory. In the comparative example of the present embodiment, it is explained that the memory system 1 is realized as, for example, a solid-state drive (SSD), but the memory system 1 may be another storage device.

The memory system 1 is configured to be connectable to a host by a system bus, for example, a PCI Express bus. As illustrated in FIG. 1, the memory system 1 includes a controller 2, a NAND flash memory 3, a dynamic random-access memory (DRAM) 4, etc.

The controller 2 has the function of controlling the operation of the memory system 1. The controller 2 includes a host interface (I/F) 2a, a CPU 2b, a NAND interface (I/F) 2c, a DRAM interface (I/F) 2d, etc. The host interface 2a, the CPU 2b, the NAND interface (I/F) 2c, and the DRAM interface 2d are connected to each other by, for example, a bus.

The host interface 2a is a host interface circuit configured to communicate with the host placed outside the memory system 1. The host interface 2a may be, for example, a PCI Express controller. The host interface 2a receives various commands (requests) from the host.

The CPU 2b is a processor configured to control the host interface 2a, the NAND interface 2c, and the DRAM interface 2d. The CPU 2b loads a control program (firmware) from the NAND flash memory 3 or a read-only memory (ROM) not illustrated in the figure into the DRAM 4 in response to the powering on of the memory system 1, and executes the control program, thereby performing various processes. More specifically, the CPU 2b performs processes in response to various commands issued from the host. Part or all of the processes performed in response to the commands issued from the host may be performed by dedicated hardware in the controller 2.

The NAND interface 2c is a memory control circuit configured to control the NAND flash memory 3 under the control of the CPU 2b.

The DRAM interface 2d is a DRAM control circuit configured to control the DRAM 4 under the control of the CPU 2b.

Moreover, the controller 2 includes a compressor (compression device) 2e and a decompressor (decompression device) 2f.

The compressor 2e is used to, for example, compress data specified in a write command (write data) when the write command is issued from the host. In the comparative example of the present embodiment, it is sufficient if the compressor 2e is configured to perform at least entropy coding. In the compressor 2e, for example, a method of compressing data by a combined compression algorithm of dictionary coding (e.g., LZ77) and entropy coding (e.g., Huffman coding) is adopted. Data compressed by the compressor 2e (hereinafter, referred to as compressed data) is output from the compressor 2e, and then subjected to predetermined processing, such as error correction and randomizing. The CPU 2b writes data obtained by subjecting the compressed data to the predetermined processing into the NAND flash memory 3 via the NAND interface 2c. That is, the CPU 2b writes the data based on the compressed data output from the compressor 2e into the NAND flash memory 3.

For example, when reading compressed data from the NAND flash memory 3 in response to a read command received from the host via the host interface 2a, the CPU 2b reads data based on the read command from the NAND flash memory 3 via the NAND interface 2c. The data read from the NAND flash memory 3 is subjected to predetermined processing, such as error correction to the data and cancelation of randomizing, and then input to the decompressor 2f by the CPU 2b as compressed data. The decompressor 2f decompresses the input compressed data. That is, the decompressor 2f decompresses the compressed data based on the data read from the NAND flash memory 3.

The NAND flash memory 3 is a nonvolatile memory and includes a memory cell array including memory cells arranged in a matrix. The NAND flash memory 3 may be a NAND flash memory of a two-dimensional structure or a NAND flash memory of a three-dimensional structure.

The memory cell array of the NAND flash memory 3 includes blocks BLK0 to BLKm-1. Each of the blocks BLK0 to BLKm-1 includes a large number of pages (here, pages P0 to Pn-1). The blocks BLK0 to BLKm-1 function as erase units. Each of the pages P0 to Pn-1 includes memory cells connected to the same word line. The pages P0 to Pn-1 are units of a data write operation and a data read operation.

It has been herein explained that the memory system 1 includes the NAND flash memory 3, but the memory system 1 may include, for example, a phase-change memory (PCM) or a magnetoresistive random-access memory (MRAM), as a nonvolatile memory.

The DRAM 4 is a volatile memory and functions as, for example, a temporary buffer of software executed in the controller 2 (CPU 2b) or a temporary buffer for the NAND flash memory 3.

It has been herein explained that the memory system 1 includes the DRAM 4, but the memory system 1 may include, for example, a static random-access memory (SRAM), as a volatile memory.

In FIG. 1, it has been explained that the compressor 2e and the decompressor 2f are incorporated in the controller 2. However, the compressor 2e and the decompressor 2f may be provided outside the controller 2 or may be provided outside the memory system 1.

Moreover, in the comparative example of the present embodiment, it is explained that the compressor 2e and the decompressor 2f are realized by hardware, but part of all of the compressor 2e and the decompressor 2f may be realized by software or may be realized by a combination of software and hardware.

An example of the configurations of the compressor 2e and the decompressor 2f illustrated in FIG. 1 will be described hereinafter with reference to FIG. 2.

The configuration of the compressor 2e will be described first. In the comparative example of the present embodiment, the compressor 2e is configured to compress write data input to the compressor 2e (hereinafter, referred to as uncompressed data), using a combined compression algorithm of dictionary coding and entropy coding, as described above.

As illustrated in FIG. 2, the compressor 2e includes a dictionary encoder 11, an encoding-table generator 12, an interleave unit 13, an entropy encoder 14, and a multiplexer 15.

The dictionary encoder 11 subjects uncompressed data input to the compressor 2e (input data) to dictionary coding (dictionary compression). Dictionary coding is an encoding technique for converting target data of dictionary coding (hereinafter, referred to as dictionary-coding target data) into a relative reference to past data before the dictionary-coding target data.

More specifically, in dictionary coding, a buffer storing past data (hereinafter, referred to as a history buffer) is prepared, and past data that matches the dictionary-coding target data is retrieved from the history buffer.

If no past data that matches the dictionary-coding target data exists in the history buffer, information indicating the dictionary-coding target data (hereinafter, referred to as literal information) is output as a result of dictionary coding.

In contrast, if past data that matches the dictionary-coding target data exists in the history buffer, a combination of information indicating a length by which the dictionary-coding target data and the past data in the history buffer match each other (hereinafter, referred to as match-length information) and information indicating a location in the history buffer where the past data is stored (i.e., the distance to the past data in the history buffer) (hereinafter, referred to as distance information) is output as a result of dictionary coding.

That is, the dictionary encoder 11 operates to subject each data item partly extracted from input data as dictionary-coding target data to dictionary coding, and to output literal information, or match-length information and distance information, which are a result of dictionary coding.

The result of dictionary coding output from the dictionary encoder 11 corresponds to target data of entropy coding (hereinafter, referred to as entropy-coding target data). The entropy-coding target data (for example, literal information, or match-length information and distance information) is referred to as symbols, and in performing entropy coding, a symbol string constituted of sequentially placed symbols is output to the encoding-table generator 12 and the interleave unit 13 as the above-described result of the dictionary coding.

Entropy coding here is an encoding technique for converting entropy-coding target data (each of symbols constituting a symbol string) into code words of code lengths corresponding to the appearance frequencies of the entropy-coding target data (i.e., variable-length codes). Entropy coding can reduce the code amount (data amount) as a whole by allocating the variable-length codes to the entropy-coding target data, using the difference in appearance frequency of the entropy-coding target data.

As entropy coding, Huffman coding is used, for example. Huffman coding, used as entropy coding, may be static Huffman coding, which performs coding using a preconstructed coding tree (Huffman tree), or dynamic Huffman coding, which changes the coding tree according to the target data of Huffman coding. Dynamic Huffman coding will be described here.

Incidentally, a compression method called Deflate (hereinafter, referred to as a Deflate compression method) generates a compressed stream (compressed data) in which the variable-length codes (Huffman codes), into which the above-described symbols constituting the symbol string have been converted by subjecting the symbols to entropy coding (Huffman coding), are sequentially packed. In other words, the Deflate compression method generates a compressed stream in which the variable-length codes are serialized. To decompress such a compressed stream, the variable-length codes packed in the compressed stream need to be extracted in order from the head. This makes the parallelization of decompression difficult (i.e., the throughput of the process of decompressing the compressed stream does not improve).

Therefore, in the comparative example of the present embodiment, it is assumed that a compression method called an interleaved storage method is adopted. The interleaved storage method is a compression method based on the above-described Deflate compression method, but is different from the Deflate compression method in that the variable-length codes into which the symbols constituting a symbol string have been converted are stored in an interleaved manner in substreams in fixed-length units.

The encoding-table generator 12 constructs a coding tree based on the respective appearance frequencies of the symbols constituting an input symbol string, and generates, from the coding tree, a table defining the variable-length codes to be allocated to the symbols (hereinafter, referred to as an encoding table). In addition, since the interleaved storage method is a compression method based on the Deflate compression method as described above, the encoding-table generator 12 generates a header (hereinafter, referred to as a Deflate header) defined in a data format (hereinafter, referred to as a Deflate format) based on the Deflate compression method. In the Deflate header, information indicating that dynamic Huffman coding is used and information for generating the above-described encoding table are set, for example.

The interleave unit 13 divides the above-described symbol string into subsymbol strings. The symbol string here is divided into a first subsymbol string constituted of first symbols of the symbol string and a second subsymbol string constituted of second symbols different from the first symbols. The interleave unit 13 outputs the first and second subsymbol strings to the entropy encoder 14.

The entropy encoder 14 includes a first variable-length encoder 141 and a second variable-length encoder 142.

The first variable-length encoder 141 inputs the first subsymbol string output from the interleave unit 13. The first variable-length encoder 141 refers to the encoding table generated by the encoding-table generator 12 and subjects each of the first symbols constituting the first subsymbol string to entropy coding. The first symbols are thereby converted into first variable-length codes, respectively. The first variable-length codes, into which the first symbols have been thus converted, respectively, are output from the first variable-length encoder 141 to the multiplexer 15.

The second variable-length encoder 142 inputs the second subsymbol string output from the interleave unit 13. The second variable-length encoder 142 refers to the encoding table generated by the encoding-table generator 12, and subjects each of the second symbols constituting the second subsymbol string to entropy coding. The second symbols are thereby converted into second variable-length codes, respectively. The second variable-length codes, into which the second symbols have been thus converted, respectively, are output from the second variable-length encoder 142 to the multiplexer 15.

The multiplexer 15 inputs the first variable-length codes output from the first variable-length encoder 141, and packs the first variable-length codes into a substream of a fixed width (hereinafter, referred to as a first substream). In addition, the multiplexer 15 inputs the second variable-length codes output from the second variable-length encoder 142, and packs the second variable-length codes into a substream of a fixed width (hereinafter, referred to as a second substream). The multiplexer 15 generates a compressed stream in which the first and second substreams are placed in order, and outputs the compressed stream. The compressed stream output from the multiplexer 15 has a data format constituted of the above-described Deflate header generated by the encoding-table generator 12 and a payload in which the first and second substreams are placed (hereinafter, an interleaved storage format).

The schematic operation of the above-described compressor 2e is briefly described here with reference to FIG. 3. In FIG. 3, it is assumed that a symbol string 100 constituted of symbols s0 to s3 is subjected to entropy coding for the sake of convenience.

In this case, the interleave unit 13 divides the symbol string 100 into a first subsymbol string 101 and a second subsymbol string 102. The first subsymbol string 101 here is constituted of the symbols s0 and s2 of the symbols s0 to s3 constituting the symbol string 100. On the other hand, the second subsymbol string 102 is constituted of the symbols s1 and s3 of the symbols s0 to s3 constituting the symbol string 100.

Then, the first variable-length encoder 141 subjects each of the symbols s0 and s2 constituting the first subsymbol string 101 to entropy coding, and thereby converts the symbol s0 into a variable-length code v0 and converts the symbol s2 into a variable-length code v2.

Similarly, the second variable-length encoder 142 subjects each of the symbols s1 and s3 constituting the second subsymbol string 102 to entropy coding, and thereby converts the symbol s1 into a variable-length code v1 and converts the symbol s3 into a variable-length code v3.

The multiplexer 15 packs the variable-length codes v0 and v2 output from the first variable-length encoder 141 to generate a first substream 103. In addition, the multiplexer 15 packs the variable-length codes v1 and v3 output from the second variable-length encoder 142 to generate a second substream 104. The multiplexer 15 outputs a compressed stream 105 in which the first substream 103 and the second substream 104 thus generated are placed in order.

The compressed stream 105 (compressed data) thus output from the compressor 2e (multiplexer 15) is subjected to the above-described predetermined processing, such as error correction and randomizing, and then written into the NAND flash memory 3.

The configuration of the decompressor 2f will be described next. If the compressor 2e is configured to compress uncompressed data by a combined compression algorithm of dictionary coding and entropy coding as described above, the decompressor 2f is configured to subject compressed data (compressed stream) to entropy decoding and subject a result of entropy decoding to dictionary decoding.

As illustrated in FIG. 2, the decompressor 2f includes an encoding-table generator 21, a demultiplexer 22, an entropy decoder 23, a deinterleave unit 24, and a dictionary decoder 25.

As described above, if a compressed stream written in the NAND flash memory 3 is read from the NAND flash memory 3, the compressed stream is input to the decompressor 2f.

The compressed stream here has a data format constituted of a Deflate header and a payload (i.e., the interleaved storage format) as described above, and in the Deflate header, information for generating the encoding table used for the above-described entropy coding is set. For this reason, the encoding-table generator 21 generates (reconstructs) an encoding table based on the information set in the Deflate header constituting the compressed stream input to the decompressor 2f.

The demultiplexer 22 extracts the first and second substreams from (the payload constituting) the compressed stream input to the decompressor 2f. Since the first and second substreams of a fixed-width are placed in order in the payload constituting the compressed stream as described above, the demultiplexer 22 can easily separate and extract the first and second substreams, based on the fixed width. The demultiplexer 22 outputs the first and second substreams extracted from the compressed stream to the entropy decoder 23.

The entropy decoder 23 includes a first variable-length decoder 231 and a second variable-length decoder 232.

The first variable-length decoder 231 inputs the first substream output from the demultiplexer 22. The first variable-length decoder 231 refers to the encoding table generated by the encoding-table generator 21, extracts the first variable-length codes packed in the first substream (first variable-length codes included in the first substream) sequentially, and decodes the first variable-length codes. The first variable-length codes are thereby converted into the first symbols, respectively. The first symbols, into which the first variable-length codes have been thus converted, are output from the first variable-length decoder 231 to the deinterleave unit 24.

The second variable-length decoder 232 inputs the second substream output from the demultiplexer 22. The second variable-length decoder 232 refers to the encoding table generated by the encoding-table generator 21, extracts the second variable-length codes packed in the second substream (second variable-length codes included in the second substream) sequentially, and decodes the second variable-length codes. The second variable-length codes are thereby converted into the second symbols, respectively. The second symbols, into which the second variable-length codes have been thus converted, are output from the second variable-length decoder 232 to the deinterleave unit 24.

The deinterleave unit 24 inputs the first symbols output from the first variable-length decoder 231 and the second symbols output from the second variable-length decoder 232, and reorders the first and second symbols. The deinterleave unit 24 outputs a symbol string constituted of the reordered first and second symbols to the dictionary decoder 25.

The dictionary decoder 25 inputs the symbol string output from the deinterleave unit 24, and subjects the input symbol string to dictionary decoding. The symbol string input to the dictionary decoder 25 corresponds to the above-described result of dictionary coding and the dictionary decoder 25 outputs decompressed data (uncompressed data) by subjecting the symbol string to dictionary decoding, the detailed description of which is omitted.

Figure 4:
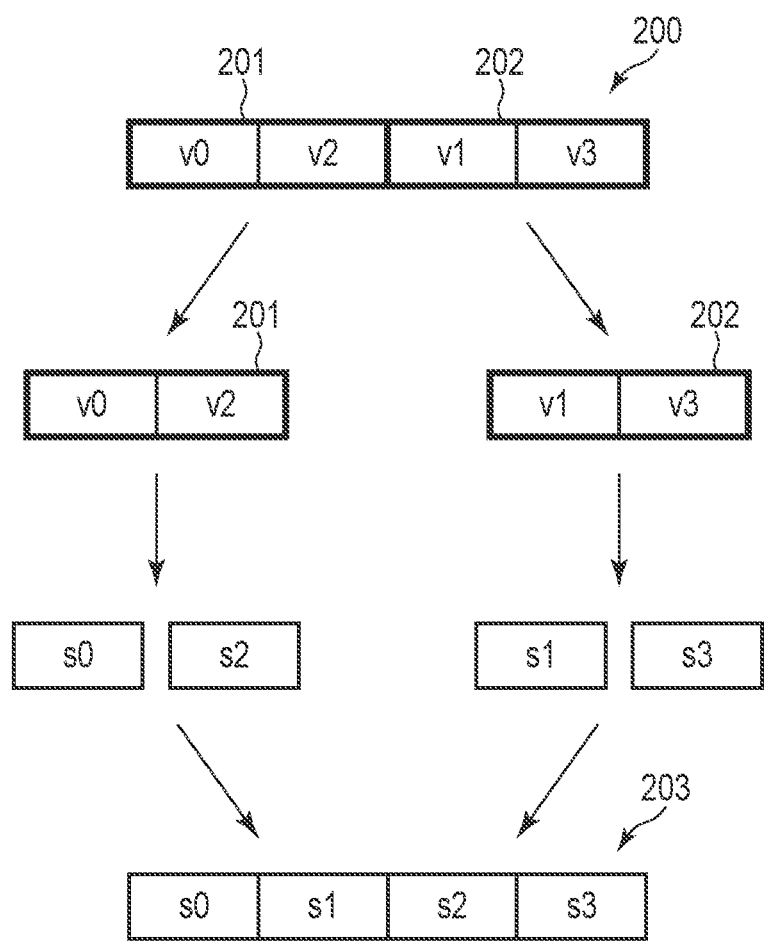
FIG. 4 is a diagram for explaining the schematic operation of the decompressor in the comparative example of the first embodiment.

The schematic operation of the above-described decompressor 2f is briefly described here with reference to FIG. 4. In FIG. 4, it is assumed that a compressed stream 200 similar to the above-described compressed stream 105 illustrated in FIG. 3 is subjected to entropy decoding for the sake of convenience.

In this case, the demultiplexer 22 extracts a first substream 201 and a second substream 202 from the compressed stream 200. The first substream 201 corresponds to the first substream 103 illustrated in FIG. 3, and the variable-length codes v0 and v2 are packed therein. In addition, the second substream 202 corresponds to the second substream 104 illustrated in FIG. 3, and the variable-length codes v1 and v3 are packed therein.

Then, the first variable-length decoder 231 sequentially extracts the variable-length codes v0 and v2 included in the first substream 201. The first variable-length decoder 231 subjects the variable-length codes v0 and v2 extracted from the first substream 201 to entropy decoding, and thereby converts the variable-length code v0 into the symbol s0 and converts the variable-length code v2 into the symbol s2.

Similarly, the second variable-length decoder 232 sequentially extracts the variable-length codes v1 and v3 included in the second substream 202. The second variable-length decoder 232 subjects the variable-length codes v1 and v3 extracted from the second substream 202 to entropy decoding, and thereby converts the variable-length code v1 into the symbol s1 and converts the variable-length code v3 into the symbol s3.

The deinterleave unit 24 reorders (integrates) the symbols s0 and s2, into which the variable-length codes v0 and v2 have been converted by the first variable-length decoder 231, and the symbols s1 and s3, into which the variable-length codes v1 and v3 have been converted by the second variable-length decoder 232, through the procedure reverse to the procedure through which the interleave unit 13 included in the compressor 2e described with reference to FIG. 3, above, divides the symbol string constituted of the symbols s0 to s3 into the first subsymbol string (symbols s0 and s2) and the second subsymbol string (symbols s1 and s3). The deinterleave unit 24 thereby can output a symbol string 203 constituted of the symbols s0 to s3.

The above-described interleaved storage method enables the decompressor 2f to process in parallel (decode in parallel) substreams extracted from a compressed stream, so that high-throughput entropy decoding can be realized (i.e., the decompression throughput can be improved).

It is herein assumed that a compressed stream written in the NAND flash memory 3 (hereinafter, referred to as a compressed stream of the interleaved storage format) is sent to an external apparatus (an electronic apparatus different from an information processing apparatus including the memory system 1 or the like) and is used in the external apparatus. In the present embodiment, to "send a compressed stream to the external apparatus" includes to directly send the compressed stream to the external apparatus, to upload (send) the compressed stream to a server apparatus (e.g., a server apparatus providing cloud computing service) connected to the external apparatus to cause the external apparatus to use the compressed stream, etc.

As described above, to cause the external apparatus to use a compressed stream of the interleaved storage format, the external apparatus needs to be provided with the same function as that of the decompressor 2f. That is, if the external apparatus is not provided with the same function as that of the decompressor 2f, the external apparatus cannot decompress a compressed stream and cannot use (decompressed data obtained by decompressing) the compressed stream.

In addition, if the external apparatus is not provided with the same function as that of the decompressor 2f, it is conceivable that, for example, decompressed data output from the decompressor 2f is sent to the external apparatus. However, sending the decompressed data (i.e., uncompressed data) increases the bandwidth usage rate.

Incidentally, since the above-described Deflate compression method has been widespread, the external apparatus is highly likely to have the function of decompressing a compressed stream compressed by the Deflate compression method (i.e., a compressed stream of the Deflate format). It is therefore conceivable that decompressed data output from the decompressor 2f is recompressed by the Deflate compression method and sent to the external apparatus. However, in this case, a compressor conforming to the Deflate compression method needs to be prepared, which increases the cost.

In light of this, the memory system 1 according to the present embodiment further includes a converter (conversion device) 2g for converting the interleaved storage format (i.e., the data format of a compressed stream generated in the compressor 2e) into, for example, the Deflate format at low cost in consideration of interoperability as illustrated in FIG. 5.

In the present embodiment, it is assumed that the converter 2g is incorporated in the controller 2. However, the converter 2g may be provided outside the controller 2 or may be provided outside the memory system 1. In addition, in the present embodiment, it is explained that the converter 2g is realized by hardware. However, part or all of the converter 2g may be realized by software or may be realized by a combination of software and hardware.

The configuration of the memory system 1 according to the present embodiment is the same as that of the memory system 1 according to the comparative example of the present embodiment described with reference to FIG. 1, etc., except that the converter 2g is provided. Therefore, in the following description, points different from those of the comparative example of the present embodiment are mainly described, and the description of the same points as those of the comparative example of the present embodiment is omitted.

An example of the configuration of the converter 2g illustrated in FIG. 5 will be described hereinafter with reference to FIG. 6. As illustrated in FIG. 6, the converter 2g includes a demultiplexer 31, a first buffer 32a, a second buffer 32b, a first code extractor 33a, a second code extractor 33b, and a deinterleave unit 34.

As described above, if a compressed stream written in the NAND flash memory 3 is read from the NAND flash memory 3, the compressed stream is input the converter 2g (demultiplexer 31). The compressed stream input to the converter 2g has a data format constituted of a Deflate header and a payload in which variable-length codes are stored in an interleaved manner (i.e., a payload in which first and second substreams are placed in order) (i.e., the interleaved storage format) as described above.

The demultiplexer 31 operates in the same way as the above-described demultiplexer 22 of the decompressor 2f, and extracts the first and second substreams from (the payload constituting) the compressed stream input to the converter 2g.

The first substream extracted by the demultiplexer 31 is, for example, stored in the first buffer 32a upon a request from the first buffer 32a. In addition, the second substream extracted by the demultiplexer 31 is, for example, stored in the second buffer 32b upon a request from the second buffer 32b.

The first code extractor 33a refers to the encoding table and instructs the first buffer 32a on the code length, and thereby extracts first variable-length codes from the first substream stored in the first buffer 32a. The first code extractor 33a outputs each of the extracted first variable-length codes to the deinterleave unit 34.

The second code extractor 33b refers to the encoding table and instructs the second buffer 32b on the code length, and thereby extracts second variable-length codes from the second substream stored in the second buffer 32b. The second code extractor 33b outputs each of the extracted second variable-length codes to the deinterleave unit 34.

The encoding table referred to by the first code extractor 33a and the second code extractor 33b is the same as the above-described encoding table generated by the encoding-table generator 21 provided in the decompressor 2f. Therefore, the encoding table referred to by the first code extractor 33a and the second code extractor 33b may be generated in the decompressor 2f (encoding-table generator 21), or may be generated by an encoding-table generator (not illustrated) provided in the converter 2g.

The deinterleave unit 34 inputs the first variable-length codes output from the first code extractor 33a and the second variable-length codes output from the second code extractor 33b, and reorders the first and second variable-length codes. The deinterleave unit 34 thereby outputs a compressed stream in which the reordered first and second variable-length codes are placed. In this manner, the compressed stream output from the deinterleave unit 34 has a data format constituted of a Deflate header and a payload in which the reordered first and second variable-length codes are placed (i.e., the Deflate format).

Figure 7:
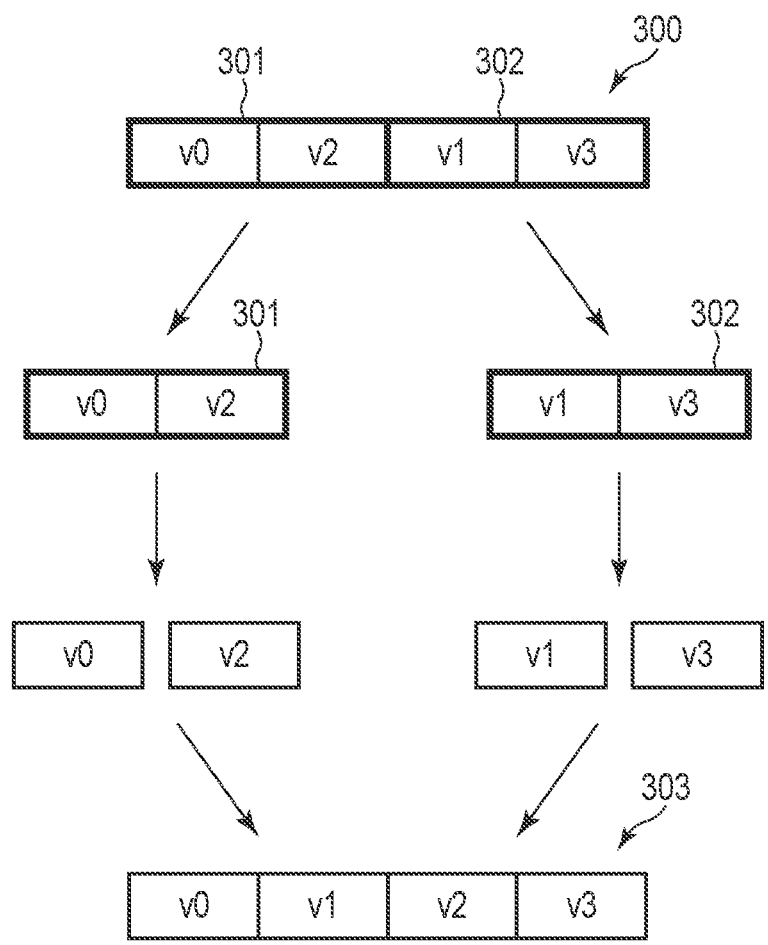
FIG. 7 is a diagram for explaining the schematic operation of the converter according to the first embodiment.

The schematic operation of the above-described converter 2g is briefly described here with reference to FIG. 7. In FIG. 7, it is assumed that the data format of a compressed stream 300 similar to the compressed stream 105 illustrated in FIG. 3, above, is converted. The compressed stream 300 has the interleaved storage format in which variable-length codes are stored in an interleaved manner in substreams.

In this case, the demultiplexer 31 extracts a first substream 301 and a second substream 302 from the compressed stream 300. The first substream 301 corresponds to the first substream 103 illustrated in FIG. 3, and the variable-length codes v0 and v2 are packed in the first substream 301. The first substream 301 is stored in the first buffer 32a. In addition, the second substream 302 corresponds to the second substream 104 illustrated in FIG. 3, and the variable-length codes v1 and v3 are packed in the second substream 302. The second substream 302 is stored in the second buffer 32b.

Then, the first code extractor 33a sequentially extracts the variable-length codes v0 and v2 packed in the first substream 301 stored in the first buffer 32a.

Similarly, the second code extractor 33b sequentially extracts the variable-length codes v1 and v3 packed in the second substream 302 stored in the second buffer 32b.

The deinterleave unit 34 reorders the variable-length codes v0 and v2 extracted from the first substream 301 by the first code extractor 33a and the variable-length codes v1 and v3 extracted from the second substream 302 by the second code extractor 33b through the same procedure as the procedure through which the deinterleave unit 24 included in the decompressor 2f reorders the symbols s0 and s2 and the symbols s1 and s3. The deinterleave unit 34 thereby can generate a compressed stream 303 constituted of a Deflate header and a payload in which the variable-length codes v0 to v3 are placed in order.

Figure 8:
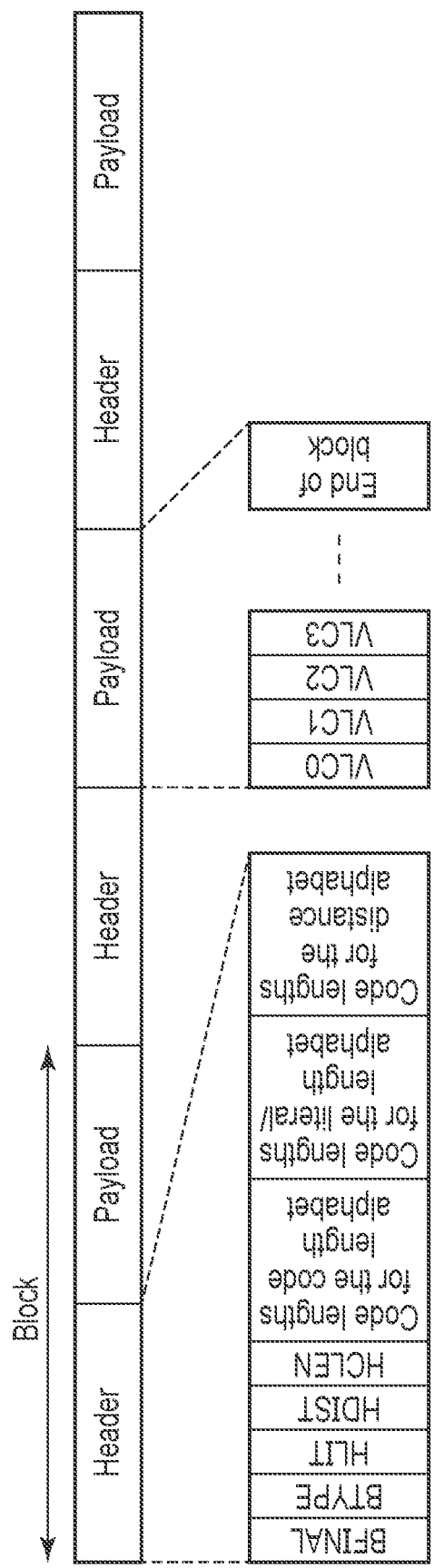
FIG. 8 is a diagram illustrating the data structure of a compressed stream of a Deflate format in the first embodiment.

FIG. 8 illustrates the data structure of a compressed stream of the Deflate format (compressed data structure). The data structure of a compressed stream of the Deflate format is defined in RFC 1951.

As illustrated in FIG. 8, the compressed stream of the Deflate format is constituted of a header (Deflate header) and a payload in which variable-length codes are placed. Information indicating that dynamic Huffman coding, described above, is used is set in BTYPE of the header, and information for generating an encoding table is set in HLIT, HDIST, HCLEN, Code lengths for the code length alphabet, Code lengths for the literal/length alphabet, and Code lengths for the distance alphabet of the header, the detailed description of which is omitted. In addition, Huffman coding is a technique for constructing a code for each block of a predetermined size, and information indicating the last block is set in BFINAL of the header.

A compressed stream of the interleaved storage format here is realized by providing the compressor 2e with the interleave unit 13 and the multiplexer 15. In other words, if the compressor 2e is not provided with the interleave unit 13 and the multiplexer 15, a compressed stream of the Deflate format is output from the compressor 2e.

Figure 9:
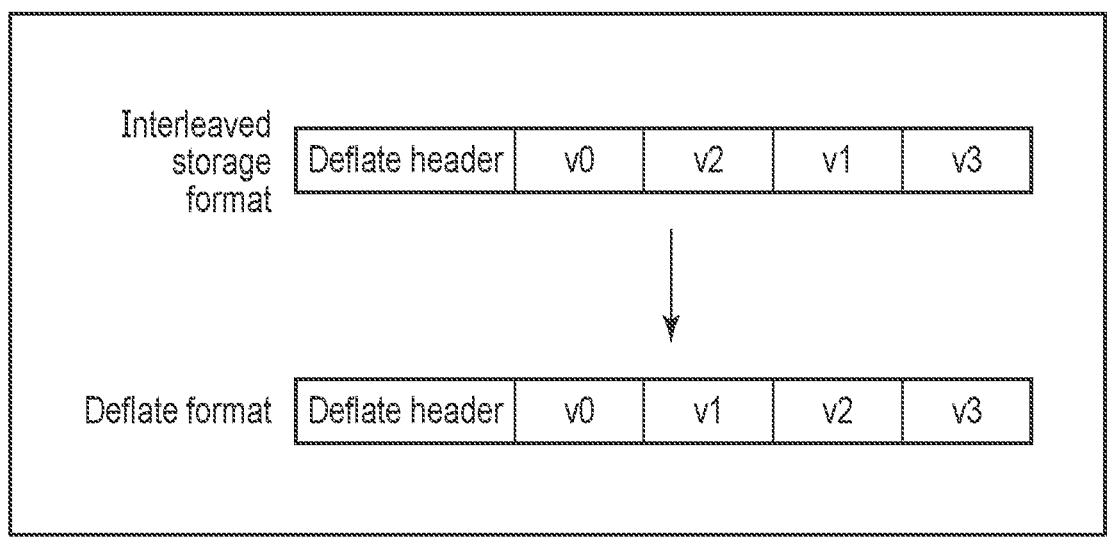
FIG. 9 is a diagram for explaining the correspondence between an interleaved storage format and the Deflate format in the first embodiment.

Therefore, in the present embodiment, (the payload constituting a compressed stream of) the interleaved storage format can be converted into the Deflate format by reordering the variable-length codes placed in the payload constituting the compressed stream of the interleaved storage format as illustrated in FIG. 9.

Incidentally, in the present embodiment, it has been explained that the converter 2g converts a compressed stream of the interleaved storage format into a compressed stream of the Deflate format. However, the converter 2g may be configured to convert a compressed stream of the interleaved storage format into, for example, a compressed stream of a data format based on a compression method called gzip using the Deflate compression method (hereinafter, referred to as a gzip format) (hereinafter, referred to as a modified example of the present embodiment).

Figure 10:
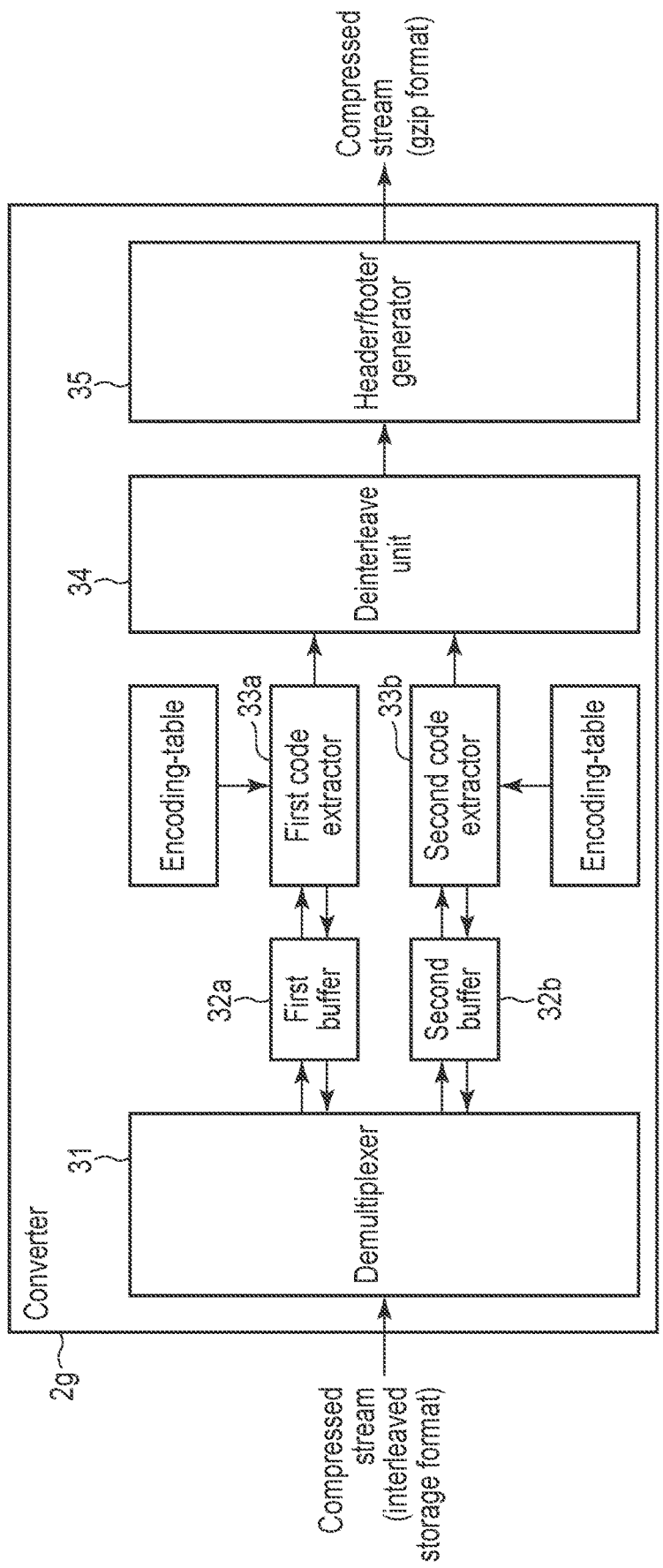
FIG. 10 is a diagram for explaining an example of the configuration of a converter according to a modified example of the first embodiment.

FIG. 10 illustrates an example of the configuration of the converter 2g according to the modified example of the present embodiment. In FIG. 10, the same portions as those of FIG. 6, described above, are denoted by the same reference symbols, and their detailed description is omitted.

In the gzip format, a header (hereinafter, referred to as a gzip header) and a footer (hereinafter, referred to as a gzip footer) defined in the gzip format are added to a compressed stream of the Deflate format.

In this case, the converter 2g illustrated in FIG. 10 further includes a header/footer generator 35. The header/footer generator 35 inputs a compressed stream of the Deflate format output from the deinterleave unit 34 as described above, and generates a gzip header and a gzip footer to be added to the compressed stream.

The data structure of the compressed stream of the gzip format is defined in RFC 1952.

According to the gzip format, ID, CM (compression method), FLG (flags), MTIME (modification time), XFL (extra flags), OS, and XLEN (extra length) are set in the gzip header. In the gzip header in the present embodiment, fixed values can be set as ID, CM, FLG, MTIME, XFL, OS, and XLEN. Therefore, the header/footer generator 35 can generate the gzip header by, for example, setting the values (fixed values) of ID, CM, FLG, MTIME, XFL, OS, and XLEN stored (prepared) in advance in the converter 2g.

On the other hand, CRC32 and ISIZE are set in the gzip footer. CRC32 is a kind of error-detecting code, and is a 32-bit length cyclic redundancy checksum (CRC). CRC32 is already calculated based on the data before compression in the compressor 2e and is stored in a storage.

ISIZE represents the size of data before compression (original data size). The original data size is, for example, included in compression control information set by the host when the compressor 2e operates. The compression control information is stored in, for example, a register in the converter 2g, and the header/footer generator 35 acquires the original data size by referring to the compression control information.

The header/footer generator 35 can generate the gzip footer by setting the CRC32 (error-correcting code) described above and the acquired original data size.

The header/footer generator 35 outputs a compressed stream of the gzip format obtained by adding the generated gzip header and gzip footer to the compressed stream of the Deflate format output from the deinterleave unit 34.

As described above, the converter 2g illustrated in FIG. 10 can convert the interleaved storage format into the gzip format.

While the gzip format has been described here, the present embodiment may be applied to a case where the interleaved storage format is converted into a data format based on a compression method called zlib (hereinafter, referred to as a zlib format). The data structure of a compressed stream of the zlib format is defined in RFC 1950. As in the case of the gzip format, it is sufficient if a header to which a fixed value is set and a footer to which an error-correcting code already calculated based on the data before compression is set are generated, and the generated header and footer are added to a compressed stream of the Deflate format.

In the present embodiment, the decompressor 2f can output decompressed data (uncompressed data) obtained by decompressing a compressed stream read from the NAND flash memory 3, and the converter 2g can output a compressed stream whose data format has been converted. The output format is specified from outside the memory system 1 (e.g., by the host) when a compressed stream is read from the NAND flash memory 3. More specifically, for example, if "decompressed data" is specified as the output format, the decompressor 2f operates and decompressed data is thereby output from the decompressor 2f. On the other hand, for example, if "a compressed stream whose data format has been converted" is specified as the output format, the converter 2g operates and a compressed stream whose data format has been converted is thereby output from the converter 2g.

The above-described output format may be specified in, for example, a read command issued from the host.

In addition, in the modified example of the present embodiment, the data format of a compressed stream output from the converter 2g may be further specified from outside. More specifically, for example, if "the Deflate format" is specified as the data format of a compressed stream, the header/footer generator 35 does not operate and a compressed stream of the Deflate format is output from the deinterleave unit 34. On the other hand, for example, if "the gzip format" or "the zlib format" is specified as the data format of a compressed stream, the header/footer generator 35 operates and a compressed stream of the gzip or zlib format is thereby output from the header/footer generator 35.

Moreover, in the comparative example of the present embodiment, it has been explained that, for example, substreams of a fixed length (fixed width) are placed in a payload constituting a compressed stream of the interleaved storage format. In contrast, in the present embodiment, the substreams may not be substreams of a fixed length if the decompressor 2f and the converter 2g can extract the substreams appropriately.

As described above, the converter 2g according to the present embodiment includes the demultiplexer 31 that inputs a compressed stream of the interleaved storage format (first compressed stream) and extracts first and second substreams from the input compressed stream, the first code extractor 33a that extracts first variable-length codes from the first substream, the second code extractor 33b that extracts second variable-length codes from the second substream, and the deinterleave unit 34 that reorders the first variable-length codes extracted from the first substream and the second variable-length codes extracted from the second substream in accordance with a symbol string (symbol string that has been subjected to entropy coding) and outputs a compressed stream of the Deflate format in which the reordered first and second variable-length codes are placed (second compressed stream).

In the present embodiment, the compressed stream of the interleaved storage format is constituted of a Deflate header and a payload in which the first and second substreams including the first and second variable-length codes, respectively, are placed, and the compressed stream of the Deflate format is constituted of a Deflate header and a payload in which the reordered first and second variable-length codes are placed.

In the present embodiment, the above-described configuration enables the data format of a compressed stream to be converted at low cost (i.e., to be converted from the interleaved storage format into the Deflate format at low cost).

More specifically, as described above, in the comparative example of the embodiment, a compressor conforming to the Deflate compression method needs to be provided; whereas in the present embodiment, the interleaved storage format can be converted into the Deflate format by simply providing the converter 2g. In the present embodiment, while the converter 2g needs to be provided, the converter 2g can convert the data format of a compressed stream by the simple process of reordering the variable-length codes (first and second variable-length codes) placed in the payload constituting the compressed stream. Thus, the conversion can be achieved at low cost, as compared to a case where a compressor for recompressing uncompressed data by the Deflate compression method is provided.

In addition, the converter 2g according to the present embodiment may further include the header/footer generator 35 that generates a header and a footer in accordance with the data format (e.g., the gzip format) based on the compression method specified from outside the memory system 1 (e.g., by the host) and may be configured to output a compressed stream of the Deflate format with the header and the footer added thereto. In this case, the header is generated by setting a fixed value prepared in advance, and the footer is generated by setting an error-detecting code already calculated based on the data before compression. This configuration enables a compressed stream of the Deflate format to be converted into a compressed stream of the gzip format.

Moreover, the memory system 1 according to the present embodiment includes the compressor 2e and the NAND flash memory 3 (nonvolatile memory), and a compressed stream output from the compressor 2e (compressed stream of the interleaved storage format) is written (stored) into the NAND flash memory 3. In addition, if a compressed stream is read from the NAND flash memory 3, decompressed data or a compressed stream whose data format has been converted (compressed stream of the Deflate format) is output in accordance with the output format specified from outside. In the present embodiment, this configuration enables desired data (decompressed data or a compressed stream whose data format has been converted) to be output in accordance with an instruction from, for example, the host.

In the present embodiment, it has been explained that the result of dictionary coding is used as symbols to perform entropy coding (i.e., the compressor 2e includes the dictionary encoder 11 and the decompressor 2f includes the dictionary decoder 25). However, the symbols in the present embodiment may be information in other formats.

Moreover, while Huffman coding has been mainly described as entropy coding in the present embodiment, entropy coding is not limited to Huffman coding.

Furthermore, in the present embodiment, it has been mainly explained that a compressed stream in which two substreams are placed (compressed stream of the interleaved storage format) is converted into a compressed stream of the Deflate format. However, the converter 2g according to the present embodiment is intended to convert a compressed stream in which at least two substreams are placed into a compressed stream of the Deflate format. That is, the converter 2g may be configured to convert, for example, a compressed stream in which first to Nth (N is an integer greater than or equal to two) substreams are placed in order into a compressed stream of the Deflate format. N is, for example, 2, 4, 8, 16, 32, or 64.

In this case, the compressor 2e needs to be configured to generate (output) a compressed stream in which the N substreams (first to Nth substreams) are placed in order. More specifically, the compressor 2e is configured to include the interleave unit 13 that divides a symbol string into N subsymbol strings (first to Nth subsymbol strings), the entropy encoder 14 that includes N variable-length encoders (first to Nth variable-length encoders) corresponding to the N subsymbol strings, and the multiplexer 15 that outputs the compressed stream in which the first to Nth substreams, in which first to Nth variable-length codes output from the first to Nth variable-length encoders are packed, respectively, are placed in order. In addition, the decompressor 2f is configured to include, for example, an entropy decoder that includes first to Nth variable-length decoders, and to decompress such a compressed stream output from the compressor 2e, the detailed description of which is omitted.

If the compressed stream in which the first to Nth substreams are placed in order is output from the compressor 2e as described above, it is sufficient if the converter 2g includes the demultiplexer 31 that extracts the first to Nth substreams from the compressed stream, first to Nth buffers and first to Nth code extractors corresponding to the first to Nth substreams, and the deinterleave unit 34 that reorders variable-length codes output from the first to Nth code extractors (first variable-length codes to Nth variable-length codes).

In the converter 2g, for example, an ith (i=1, 2, ..., N) substream of the first to Nth substreams corresponds to an ith buffer and an ith code extractor, and ith variable-length codes extracted from the ith substream are output from the ith code extractor. That is, in the present embodiment, for example, to "extract the first variable-length codes to the Nth variable-length codes from the first to Nth substreams" means extracting the ith variable-length codes from the ith substream, and does not include extracting variable-length codes other than the ith variable-length codes (e.g., i+1th variable-length codes or i−1th variable-length codes) from the ith substream. While the converter 2g has been described here, in the compressor 2e, an ith subsymbol string of the first to Nth subsymbol strings corresponds to an ith variable-length encoder, and the ith variable-length codes output from the ith variable-length encoder are packed in the ith substream.

The above-described configuration enables the converter 2g to convert a compressed stream of the interleaved storage format in which N substreams are placed into a compressed stream of the Deflate format. While it has been herein explained that a compressed stream of the interleaved storage format is converted into a compressed stream of the Deflate format, the compressed stream of the interleaved storage format is converted into a compressed stream of the gzip format or the zlib format in the same way.

Second Embodiment

A second embodiment will be described next. In the present embodiment, the detailed description of the same portions as those of the above-described first embodiment is omitted, and portions different from those of the first embodiment are mainly described.

In the above-described first embodiment, it has been explained that a memory system includes a compressor, a decompressor, and a converter. The present embodiment is different from the first embodiment in that a decompressor and a converter are integrated. That is, a decompressor of a memory system of the present embodiment is a decompressor having the function of converting the data format of a compressed stream explained in the above-described first embodiment (i.e., a decompressor with the function of converting compressed data).

In this case, the configuration of the memory system according to the present embodiment is the same as the above-described configuration illustrated in FIG. 2. Thus, the configuration of the memory system 2 according to the present embodiment is be described with reference to FIG. 2.

Figure 11:
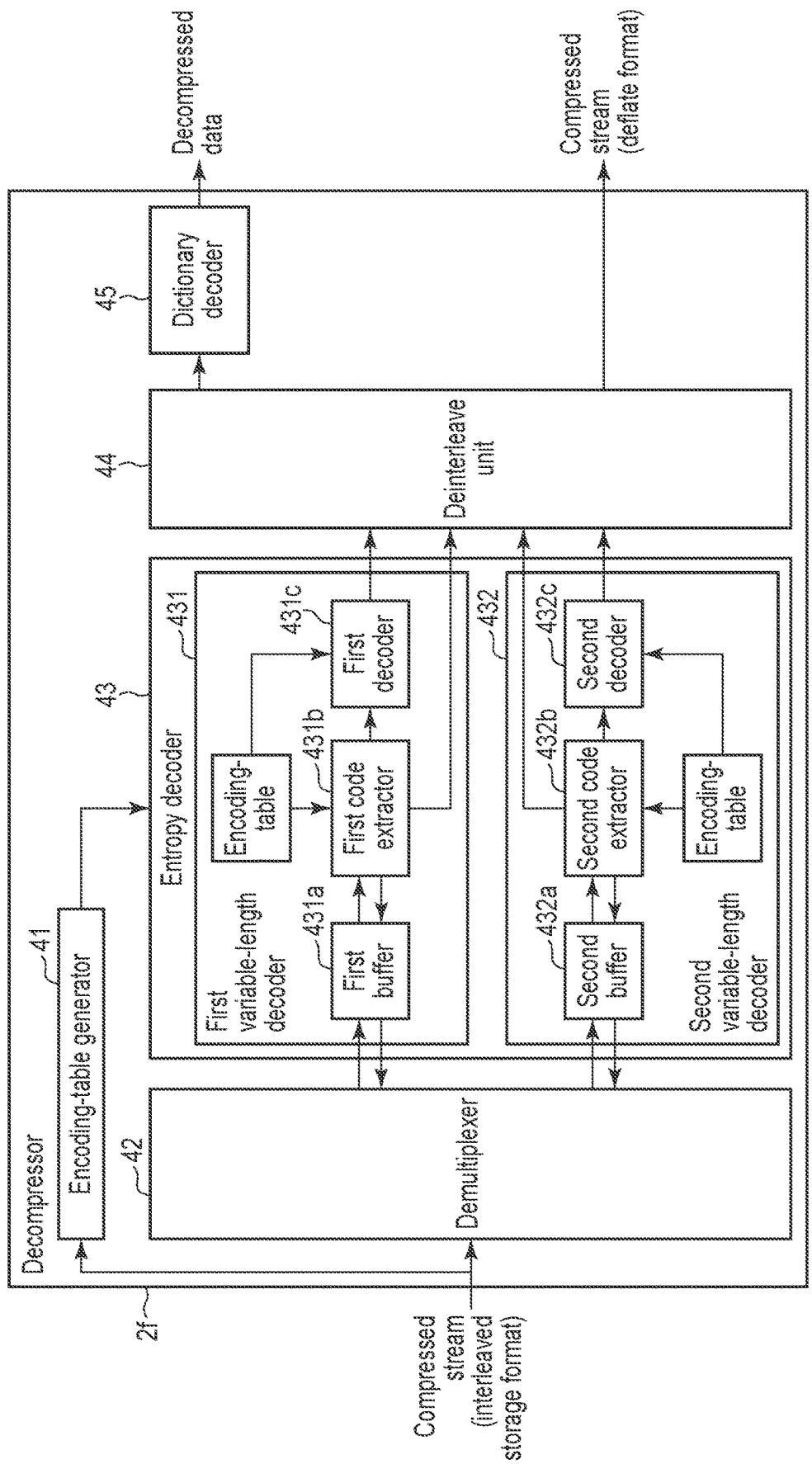
FIG. 11 is a diagram illustrating an example of the configuration of a decompressor according to a second embodiment.

An example of the configuration of a decompressor 2f according to the present embodiment will be described hereinafter with reference to FIG. 11. As illustrated in FIG. 11, the decompressor 2f includes an encoding-table generator 41, a demultiplexer 42, an entropy decoder 43, a deinterleave unit 44, and a dictionary decoder 45.

When a compressed stream written in a NAND flash memory 3 (compressed stream of the interleaved storage format) is read from the NAND flash memory 3, the compressed stream is input to the decompressor 2f.

The encoding-table generator 41 generates (reconstructs) an encoding table based on information set in a Deflate header constituting the compressed stream input to the decompressor 2f in the same way as the encoding-table generator 21 of the decompressor 2f explained in the above-described first embodiment.

The demultiplexer 42 extracts first and second substreams from (a payload constituting) the compressed stream input to the decompressor 2f in the same way as the demultiplexer 22 of the decompressor 2f and the demultiplexer 31 of the converter 2g explained in the above-described first embodiment. The demultiplexer 42 outputs the first and second substreams extracted from the compressed stream to the entropy decoder 43.

The entropy decoder 43 includes a first variable-length decoder 431 and a second variable-length decoder 432.

The first variable-length decoder 431 includes a first buffer 431a, a first code extractor 431b, and a first decoder 431c.

The first buffer 431a stores the first substream output from the demultiplexer 42 in the same way as the first buffer 32a of the converter 2g explained in the above-described first embodiment.

The first code extractor 431b refers to the encoding table generated by the encoding-table generator 41 and extracts first variable-length codes from the first substream stored in the first buffer 431a in the same way as the first code extractor 33a of the converter 2g explained in the above-described first embodiment.

In the present embodiment, it is herein assumed that the output format is specified from outside the memory system 1 as explained in the above-described first embodiment. If "decompressed data" is specified as the output format, the first code extractor 431b outputs the first variable-length codes extracted from the first substream to the first decoder 431c. On the other hand, if "a compressed stream whose data format has been converted" is specified as the output format, the first code extractor 431b outputs the first variable-length codes extracted from the first substream to the deinterleave unit 44.

The first decoder 431c refers to the encoding table generated by the encoding-table generator 41 and decodes each of the first variable-length codes output from the first code extractor 431b (i.e., converts the first variable-length codes into first symbols) in the same way as the first variable-length decoder 231 of the decompressor 2f explained in the above-described first embodiment. The first symbols, into which the first variable-length codes have been thus converted, are output from the first decoder 431c to the deinterleave unit 44.

The second variable-length decoder 432 includes a second buffer 432a, a second code extractor 432b, and a second decoder 432c.

The second buffer 432a stores the second substream output from the demultiplexer 42 in the same way as the second buffer 32b of the converter 2g explained in the above-described first embodiment.

The second code extractor 432b refers to the encoding table generated by the encoding-table generator 41 and extracts second variable-length codes from the second substream stored in the second buffer 432a in the same way as the second code extractor 33b of the converter 2g explained in the above-described first embodiment.

Here, if "decompressed data" is specified as the output format as described above, the second code extractor 432b outputs the second variable-length codes extracted from the second substream to the second decoder 432c. On the other hand, if "a compressed stream whose data format has been converted" is specified as the output format, the second code extractor 432b outputs the second variable-length codes extracted from the second substream to the deinterleave unit 44.

The second decoder 432c refers to the encoding table generated by the encoding-table generator 41 and decodes each of the second variable-length codes output from the second code extractor 432b (i.e., converts the second variable-length codes into second symbols) in the same way as the second variable-length decoder 232 of the decompressor 2f explained in the above-described first embodiment. The second symbols, into which the second variable-length codes have been thus converted, are output from the second decoder 432c to the deinterleave unit 44.

If "decompressed data" is specified as the output format as described above, the deinterleave unit 44 inputs the first symbols output from the first decoder 431c and the second symbols output from the second decoder 432c. The deinterleave unit 44 reorders the input first and second symbols in the same way as the deinterleave unit 24 of the decompressor 2f explained in the above-described first embodiment. The deinterleave unit 44 outputs a symbol string constituted of the reordered first and second symbols to the dictionary decoder 45.

The dictionary decoder 45 outputs decompressed data by subjecting the symbol string output from the deinterleave unit 44 to dictionary decoding in the same way as the dictionary decoder 25 of the decompressor 2f explained in the above-described first embodiment.

On the other hand, if "a compressed stream whose data format has been converted" is specified as the output format, the deinterleave unit 44 inputs the first variable-length codes output from the first code extractor 431b and the second variable-length codes output from the second code extractor 432b. The deinterleave unit 44 reorders the input first and second variable-length codes in the same way as the deinterleave unit 34 of the converter 2g explained in the above-described first embodiment. The deinterleave unit 44 outputs a compressed stream in which the reordered first and second variable-length codes are placed (i.e., a compressed stream of the Deflate format).

As described above, the decompressor 2f illustrated in FIG. 11 is configured to have the function of outputting decompressed data (uncompressed data) obtained by decompressing a compressed stream of the interleaved storage format in accordance with the output format specified from outside, and the function of outputting a compressed stream which has been converted from the interleaved storage format into the Deflate format (i.e., converting the data format of the compressed stream).

While it has been herein explained that the decompressor 2f converts a compressed stream of the interleaved storage format into a compressed stream of the Deflate format, the decompressor 2f according to the present embodiment may be configured to convert a compressed stream of the interleaved storage format into, for example, a compressed stream of the gzip format (hereinafter, referred to as a modified example of the present embodiment). In this case, it is sufficient if the decompressor 2f according to the modified example of the present embodiment further includes a header/footer generator 46 as illustrated in FIG. 12. The header/footer generator 46 is configured in the same way as the header/footer generator 35 of the converter 2g explained in the first embodiment. According to the modified example of the present embodiment, a compressed stream of the gzip format can be output by adding a gzip header and a gzip footer generated by the header/footer generator 46 to a compressed stream of the Deflate format output from the deinterleave unit 44.

As described above, the present embodiment enables (the memory system 1 including) the decompressor 2f to have the function of converting the data format of a compressed stream at low cost. According to this configuration, the converter 2g does not need to be provided separately from the decompressor 2f as explained in the above-described first embodiment, which can contribute to a reduction of the size of the memory system 1.

The decompressor 2f according to the present embodiment may be configured to have the function of decompressing a compressed stream of the interleaved storage format in which N substreams are placed and the function of converting the compressed stream of the interleaved storage format into a compressed stream of the Deflate format, etc., the detailed description of which is omitted.

The above-described at least one embodiment can provide a converter that can convert the data format of a compressed stream at low cost, a memory system, and a decompressor.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A conversion device comprising:
a demultiplexer configured to extract first to Nth substreams from a first compressed stream including the first to Nth substreams, where N is an integer greater than or equal to two, the first to Nth substreams being placed in order in the first compressed stream and including first variable-length codes to Nth variable-length codes into which first symbols to Nth symbols of a symbol string have been converted by subjecting the first symbols to the Nth symbols to entropy coding;
first to Nth extractors configured to extract the first variable-length codes to the Nth variable-length codes from the first to Nth substreams; and
a deinterleave unit configured to reorder the first variable-length codes to the Nth variable-length codes in accordance with the symbol string and output a second compressed stream in which the reordered first variable-length codes to Nth variable-length codes are placed.

2. The conversion device of claim 1, further comprising
a generator configured to generate a header and a footer in accordance with a data format based on a compression method specified from outside, wherein
the second compressed stream is output with the generated header and footer added to the second compressed stream.

3. The conversion device of claim 2, wherein
the header is generated by setting one or more fixed values prepared in advance, and
the footer is generated by setting an error-detecting code calculated based on data before compression.

4. The conversion device of claim 1, wherein
the first compressed stream includes a Deflate header defined in a data format based on a Deflate compression method and a payload in which the first to Nth substreams are placed, and
the second compressed stream includes the Deflate header and a payload in which the reordered first variable-length codes to Nth variable-length codes are placed.

5. A memory system comprising:
a nonvolatile memory; and
a controller including a compression device including an interleave unit configured to divide a symbol string into first symbols to Nth symbols, first to Nth variable-length encoders configured to convert the first symbols to the Nth symbols into first variable-length codes to Nth variable-length codes by subjecting the first symbols to the Nth symbols to entropy coding, and a multiplexer configured to output a first compressed stream in which first to Nth substreams including the first variable-length codes to the Nth variable-length codes are placed in order, the controller storing the first compressed stream in the nonvolatile memory, wherein
the controller is configured to read the first compressed stream from the nonvolatile memory,
the controller includes:
a decompression device including a demultiplexer configured to extract the first to Nth substreams from the read first compressed stream, first to Nth variable-length decoders configured to extract the first variable-length codes to the Nth variable-length codes from the first to Nth substreams and convert the extracted first variable-length codes to Nth variable-length codes into the first symbols to the Nth symbols by subjecting the extracted first variable-length codes to Nth variable-length codes to entropy decoding, and a deinterleave unit configured to output the symbol string by reordering the first symbols to the Nth symbols, into which the first variable-length codes to the Nth variable-length codes have been converted; and
the conversion device of claim 1,
the decompression device is configured to output the symbol string when a first output format is specified from outside, and
the conversion device is configured to output the second compressed stream when a second output format different from the first output format is specified from outside.

6. The memory system of claim 5, wherein
the compression device further includes a dictionary encoder configured to output the symbol string to the demultiplexer by subjecting uncompressed data input to the compression device to dictionary coding, and
the decompression device further includes a dictionary decoder configured to output the uncompressed data by subjecting the symbol string output from the deinterleave unit to dictionary decoding.

7. A decompression device comprising:
a demultiplexer configured to extract first to Nth substreams from a first compressed stream including the first to Nth substreams, where N is an integer greater than or equal to two, the first to Nth substreams being placed in order in the first compressed stream and including first variable-length codes to Nth variable-length codes into which first symbols to Nth symbols of a symbol string have been converted by subjecting the first symbols to the Nth symbols to entropy coding;
first to Nth extractors configured to extract the first variable-length codes to the Nth variable-length codes from the first to Nth substreams;
first to Nth decoders configured to convert the first variable-length codes to the Nth variable-length codes into the first symbols to the Nth symbols by subjecting the first variable-length codes to the Nth variable-length codes to entropy decoding; and
a deinterleave unit configured to:
output the symbol string by reordering the first symbols to the Nth symbols, into which the first variable-length codes to the Nth variable-length codes have been converted, when a first output format is specified from outside, and
reorder the first variable-length codes to the Nth variable-length codes extracted from the first to Nth substreams in accordance with the symbol string and output a second compressed stream in which the reordered first variable-length codes to Nth variable-length codes are placed, when a second output format different from the first output format is specified from outside.

8. The decompression device of claim 7, further comprising
a generator configured to generates a header and a footer in accordance with a data format based on a compression method specified from outside, wherein
the second compressed stream is output with the generated header and footer added to the second compressed stream.

9. The decompression device of claim 8, wherein
the header is generated by setting one or more fixed values prepared in advance, and
the footer is generated by setting an error-detecting code calculated based on data before compression.

10. The decompression device of claim 7, wherein
the first compressed stream includes a Deflate header defined in a data format based on a Deflate compression method and a payload in which the first to Nth substreams are placed, and
the second compressed stream includes the Deflate header and a payload in which the reordered first variable-length codes to Nth variable-length codes are placed.

11. A memory system comprising:
a nonvolatile memory; and
a controller including a compression device including an interleave unit configured to divide a symbol string into first symbols to Nth symbols, first to Nth variable-length encoders configured to convert the first symbols to the Nth symbols into first variable-length codes to Nth variable-length codes by subjecting the first symbols to the Nth symbols to entropy coding, and a multiplexer configured to output a first compressed stream in which first to Nth substreams including the first variable-length codes to the Nth variable-length codes are placed in order, the controller storing the first compressed stream in the nonvolatile memory, wherein
the controller is configured to read the first compressed stream from the nonvolatile memory, and
the controller includes the decompression device of claim 7.

12. The memory system of claim 11, wherein
the compression device further includes a dictionary encoder configured to output the symbol string to the demultiplexer by subjecting uncompressed data input to the compression device to dictionary coding, and
the decompression device further includes a dictionary decoder configured to output the uncompressed data by subjecting the symbol string output from the deinterleave unit to dictionary decoding.

13. A method of controlling a nonvolatile memory, the method comprising:
dividing a symbol string into first symbols to Nth symbols;
converting the first symbols to the Nth symbols into first variable-length codes to Nth variable-length codes by subjecting the first symbols to the Nth symbols to entropy coding;
outputting a first compressed stream in which first to Nth substreams including the first variable-length codes to the Nth variable-length codes are placed in order;
storing the first compressed stream in the nonvolatile memory;
reading the first compressed stream from the nonvolatile memory;
extracting the first to Nth substreams from the read first compressed stream;
extracting the first variable-length codes to the Nth variable-length codes from the first to Nth substreams, and converting the extracted first variable-length codes to Nth variable-length codes into the first symbols to the Nth symbols by subjecting the extracted first variable-length codes to Nth variable-length codes to entropy decoding;
outputting the symbol string by reordering the first symbols to the Nth symbols, into which the first variable-length codes to the Nth variable-length codes have been converted; and
reordering the first variable-length codes to the Nth variable-length codes in accordance with the symbol string and outputting a second compressed stream in which the reordered first variable-length codes to Nth variable-length codes are placed, wherein
the outputting the symbol string includes outputting the symbol string when a first output format is specified from outside, and
the outputting the second compressed stream includes outputting the second compressed stream when a second output format different from the first output format is specified from outside.

14. The method of claim 13, further comprising
generating a header and a footer in accordance with a data format based on a compression method specified from outside, wherein
the second compressed stream is output with the generated header and footer added to the second compressed stream.

15. The method of claim 14, further comprising:
calculating an error-detecting code based on data before compression, wherein
the header is generated by setting one or more fixed values prepared in advance, and
the footer is generated by setting the error-detecting code.

16. The method of claim 13, wherein
the first compressed stream includes a Deflate header defined in a data format based on a Deflate compression method and a payload in which the first to Nth substreams are placed, and
the second compressed stream includes the Deflate header and a payload in which the reordered first variable-length codes to Nth variable-length codes are placed.

17. The method of claim 13, further comprising:
outputting the symbol string to be divided into the first symbols to the Nth symbols by subjecting input uncompressed data to dictionary coding; and
outputting the uncompressed data by subjecting the symbol string output by reordering the first symbols to the Nth symbols to dictionary decoding.

* * * * *